US006911708B2

(12) United States Patent
Park

(10) Patent No.: US 6,911,708 B2
(45) Date of Patent: Jun. 28, 2005

(54) DUPLEXER FILTER HAVING FILM BULK ACOUSTIC RESONATOR AND SEMICONDUCTOR PACKAGE THEREOF

(75) Inventor: Jae-Yeong Park, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/780,713

(22) Filed: Feb. 19, 2004

(65) Prior Publication Data

US 2004/0164367 A1 Aug. 26, 2004

(30) Foreign Application Priority Data

Feb. 21, 2003 (KR) .............................. 10-2003-0011088

(51) Int. Cl.[7] .............................................. H01L 29/84
(52) U.S. Cl. ...................... 257/416; 257/125; 257/414; 257/415; 438/48; 438/49; 438/50; 333/188; 333/195; 333/133; 310/312; 310/364
(58) Field of Search ....................... 257/125, 414–416; 438/48, 49, 50; 333/188, 195, 133; 310/312, 364

(56) References Cited

U.S. PATENT DOCUMENTS

2002/0070262 A1 * 6/2002 Bradley et al. ........... 228/179.1
2002/0123177 A1 * 9/2002 Ruby et al. ................. 438/151
2003/0011446 A1 * 1/2003 Bradley ...................... 333/187
2003/0128081 A1 * 7/2003 Ella et al. ................... 333/133
2004/0132487 A1 * 7/2004 Kearns ..................... 455/552.1

OTHER PUBLICATIONS

Lakin et al., "High Performance Stacked Crystal Filters for GPS and Wide Bandwidth Applications", IEEE, 2001.*

* cited by examiner

Primary Examiner—Nathan J. Flynn
Assistant Examiner—Scott R. Wilson
(74) Attorney, Agent, or Firm—Birch, Stewart, Kolasch & Birch, LLP

(57) ABSTRACT

Disclosed are a film bulk acoustic resonator, a duplexer filter having the same, and a semiconductor package thereof. The film bulk acoustic resonator comprising: a semiconductor substrate; a lower electrode more than two layers formed at an upper surface of the semiconductor substrate; a piezoelectric layer deposited on an upper surface of the lower electrode with a certain thickness; and an upper electrode more than two layers formed at an upper surface of the piezoelectric layer, has an excellent bonding characteristic. The duplexer filter can microminiaturize a size thereof by integrating a film bulk acoustic filter formed by connecting the plurality of film bulk acoustic resonators serially and in parallel and peripheral passive elements of the film bulk acoustic filter into one semiconductor chip. Also, the semiconductor package is suitable for the duplexer filter.

5 Claims, 9 Drawing Sheets

DUPLEXER FILTER HAVING FILM BULK ACOUSTIC RESONATOR AND SEMICONDUCTOR PACKAGE THEREOF

BACKGROUND OF THE INVENTION

This Nonprovisional application claims priority under 35 U.S.C. §119(a) on Patent Application No(s). 10-2003-0011088 filed in KOREA on Feb. 21, 2003, the entire contents of which are hereby incorporated by reference.

1. Field of the Invention

The present invention relates to a duplexer filter, and more particularly, to a duplexer filter having a film bulk acoustic resonator and a semiconductor package thereof.

2. Description of the Prior Art

Generally, a film bulk acoustic resonator (FBAR) is a filter using a bulk acoustic wave of a piezoelectric layer. A size of a general frequency filter is proportional to a wavelength of an electromagnetic wave in a usage frequency band. Therefore, the size of a general frequency filter using the electromagnetic wave is relatively large. For example, when the frequency of the electromagnetic wave is 1 GHz, the size of a general frequency filter is approximately 30 cm, and when the frequency of the electromagnetic wave is 300 GHZ, the size of a general frequency filter is approximately 1 mm. However, if the bulk acoustic wave of the piezoelectric layer is used, a wavelength of the bulk acoustic wave becomes less as 1/10,000 of a wavelength of the electromagnetic wave. According to this, the electromagnetic wave is converted into the bulk acoustic wave by the piezoelectric layer, and the size of the filter becomes less in proportion to the wavelength of the bulk acoustic wave. That is, the size of the frequency filter using the bulk acoustic wave is approximately several hundreds of microns, and a plurality of the frequency filters using the bulk acoustic wave can be fabricated at one time through a semiconductor process.

FIG. 1A is a view showing a film bulk acoustic resonator fabricated by a bulk micromachining process in accordance with the prior art.

As shown, the bulk acoustic resonator 10 fabricated by the conventional bulk micromachining process comprises: a semiconductor substrate 11 having a hole 12 formed at a lower portion by being etched by the bulk micromachining process; a film 13 formed on the semiconductor substrate 11 and covering the hole 12; a lower electrode 14 deposited on the film 13; a piezoelectric layer 15 formed on the exposed surfaces of the lower electrode 14; and an upper electrode 16 deposited on the piezoelectric layer 15.

However, when the film bulk acoustic resonator is to be fabricated by the bulk micromachining process, the semiconductor substrate 11 has to be immersed into etching solution for a long time in order to form a certain hole 12 at the semiconductor substrate 11. According to this, it takes a long time to fabricate the film bulk acoustic resonator and a damage risk is great when the film bulk acoustic resonators which have been fabricated on the semiconductor substrate are respectively separated.

FIG. 1B is a view showing a film bulk acoustic resonator fabricated by the conventional surface micromachining process in order to solve the problem of FIG. 1A.

As shown, the bulk acoustic resonator 20 fabricated by the conventional surface micromachining process comprises: a semiconductor substrate 21 having an air layer 22 formed at the upper portion thereof; a lower electrode 14 formed on the air layer 22 of the semiconductor substrate 21; a piezoelectric layer 15 formed on the exposed upper surface of the lower electrode 14; and an upper electrode 16 deposited on the piezoelectric layer 15.

The film bulk acoustic resonator fabricated by the conventional surface micromachining process is not provided with the hole 12, so that a semiconductor chip is not easily broken at the time of separation. Also, an area of the air layer 22 is not increased, so that the number of semiconductor chips per one semiconductor substrate is increased. However, in the film bulk acoustic resonator fabricated by the conventional surface micromachining process, it is very difficult to control stresses of the lower electrode 14 and the piezoelectric layer 15 positioned on the air layer 22 thereby to have a low yield rate.

FIG. 1C is a view showing a film bulk acoustic resonator fabricated by using a film bulk acoustic reflective layer 32 in accordance with the conventional art in order to solve the problem of FIG. 1B. The acoustic reflective layer 32 is called as a bragg reflector.

As shown, the film bulk acoustic resonator 30 fabricated by using the acoustic reflective layer 32 comprises: a semiconductor substrate 31; an acoustic reflective layer 32 deposited on the semiconductor substrate 31; a lower electrode 14 deposited on the acoustic reflective layer 32; a piezoelectric layer 15 formed on the exposed surfaces of the lower electrode 14; and an upper electrode 16 deposited on the piezoelectric layer 15. Herein, the acoustic reflective layer 32 is a layer formed by sequentially depositing $SiO_2$ and W on the surface of the semiconductor substrate 31, the lower electrode 14 and the upper electrode 16 is an electrode by depositing Mo, and the piezoelectric layer 15 is a layer formed by depositing ZnO or AlN by an RF magnetron sputtering.

However, in the conventional film bulk acoustic resonators 10, 20, and 30, the lower electrode 14 formed at the semiconductor substrates 11, 21, and 31 is formed as a single layer, thereby lowering a bonding characteristic between the lower electrode 14 and the semiconductor substrates 11, 21, and 31. Also, it is difficult to extend the lower electrode 14 and the piezoelectric layer 15 having a c-axis orientation because of the influence of the semiconductor substrates 11, 21, and 31.

Hereinafter, a duplexer filter having the conventional film bulk acoustic resonator, and a plurality of passive elements such as inductors and capacitors connected to the duplexer filter will be explained with reference to FIG. 2.

FIG. 2 is a block diagram showing a duplexer filter having the conventional film bulk acoustic resonator and passive elements.

As shown, the duplexer filter 40 connected to an antenna of a mobile terminal and etc. comprises: a transmission side band-pass filter 41 and a reception side band-pass filter 42 provided with a plurality of film bulk acoustic resonators 10 connected serially and in parallel, for passing only a predetermined frequency band; and a plurality of passive elements 43 such as a plurality of inductors and capacitors connected between the transmission side band-pass filter 41 and the reception side band-pass filter 42. The reference numeral S denotes a serial connection state of the film bulk acoustic resonator, and P denotes a parallel connection state of the film bulk acoustic resonator.

Therefore, even if the transmission side band-pass filter and the reception side band-pass filter are fabricated as a size less than 1 mm×1 mm by being integrated into one semiconductor chip, passive elements such as a plurality of different inductors and capacitors are arranged at the periphery of the transmission side band-pass filter and the reception side band-pass filter. According to this, the duplexer filter actually has a size corresponding to approximately 11 mm×9 mm. Eventually, the conventional duplexer filter serves as a great obstacle in reducing a size of a mobile communication device such as a mobile terminal, and thereby a technique for integrating and packaging the conventional duplexer filter into one semiconductor chip is required.

A duplexer filter according to another conventional technique is disclosed in U.S. Pat. No. 6,559,735 which has been registered on May 6, 2003.

SUMMARY OF THE INVENTION

Accordingly, an object of the present invention is to provide a film bulk acoustic resonator having an excellent bonding characteristic with a semiconductor substrate and having an excellent characteristic of a piezoelectric layer.

Another object of the present invention is to provide a duplexer filter capable of microminiaturizing a size thereof by integrating a film bulk acoustic filter for filtering a certain band in a transmission/reception frequency by connecting a plurality of film bulk acoustic resonators serially and in parallel and peripheral necessary passive elements of the film bulk acoustic filter into one semiconductor chip.

Still another object of the present invention is to provide a semiconductor package suitable for a duplexer filter or capable of microminiaturizing the duplexer filter.

To achieve these and other advantages and in accordance with the purpose of the present invention, as embodied and broadly described herein, there is provided a film bulk acoustic resonator comprising: a semiconductor substrate; a lower electrode more than two layers formed at an upper surface of the semiconductor substrate; a piezoelectric layer deposited on the upper surface of the lower electrode with a certain thickness; and an upper electrode more than two layers formed at an upper surface of the piezoelectric layer.

To achieve these and other advantages and in accordance with the purpose of the present invention, as embodied and broadly described herein, there is also provided a duplexer filter comprising: a semiconductor substrate; a transmission side film bulk acoustic filter formed at an upper surface of the semiconductor substrate accordingly as a plurality of film bulk acoustic resonators are connected serially and in parallel; a reception side film bulk acoustic filter formed at one side of the transmission side film bulk acoustic filter accordingly as a plurality of film bulk acoustic resonators are connected serially and in parallel; and a plurality of passive elements formed at one side of the transmission side film bulk acoustic filter and the reception side film bulk acoustic filter.

To achieve these and other advantages and in accordance with the purpose of the present invention, as embodied and broadly described herein, there is still also provided a semiconductor package comprising: a semiconductor chip having a transmission side film bulk acoustic filter and a reception side film bulk acoustic filter formed at an upper surface of a semiconductor substrate accordingly as a plurality of film bulk acoustic resonators are connected serially and in parallel; a substrate provided with a ceramic body having a cavity of a certain space so that the semiconductor chip can be mounted, a ground plan formed at a bottom surface of the cavity of the ceramic body, a plurality of conductive ground vias connected to the ground plan for penetrating the ceramic body, and a plurality of signal wires formed from an outer circumference surface of the cavity of the ceramic body to a bottom surface thereof; a plurality of conductive wires for connecting the semiconductor chip, the ground plan, and the signal wires; and a lid for covering an upper portion of the cavity of the substrate so that the semiconductor chip and the conductive wires can be protected from the external environment.

The semiconductor package according to the present invention comprises: a semiconductor chip having a transmission side film bulk acoustic filter and a reception side film bulk acoustic filter formed at an upper surface of a semiconductor substrate accordingly as a plurality of film bulk acoustic resonators are connected serially and in parallel; a substrate provided with a ceramic body where the semiconductor chip is mounted, a plurality of wire patterns formed at an upper surface of the ceramic body so that the semiconductor chip can be connected thereto by a solder as a flip chip form with an overturned state, and a plurality of conductive ground vias and signal conductive vias connected to the plurality of wire patterns and penetrating the ceramic body; and a sealing layer for sealing the semiconductor chip of the upper surface of the ceramic body for the protection from the external environment.

The semiconductor package according to the present invention comprises: a semiconductor chip having a transmission side film bulk acoustic filter and a reception side film bulk acoustic filter formed at an upper surface of a semiconductor substrate accordingly as a plurality of film bulk acoustic resonators are connected serially and in parallel; a substrate having an insulating body where the semiconductor chip is mounted and having a plurality of wire patterns formed at an upper surface of the insulating body so that the semiconductor chip can be connected thereto by a solder as a flip chip form with an overturned state; and a sealing layer for sealing the semiconductor chip of the upper surface of the insulating body for the protection from the external environment.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, with reference to FIGS. 3A to 10B, will be explained a film bulk acoustic resonator having an excellent bonding characteristic with a semiconductor substrate and having an excellent characteristic of a piezoelectric layer, a duplexer capable of microminiaturizing a size thereof by integrating a film bulk acoustic filter for filtering a certain band in a transmission/reception frequency by connecting a plurality of film bulk acoustic resonators serially and in parallel and peripheral necessary passive elements into one semiconductor chip, and a semiconductor package suitable for the duplexer filter or capable of microminiaturizing the duplexer filter.

Figure 1A:
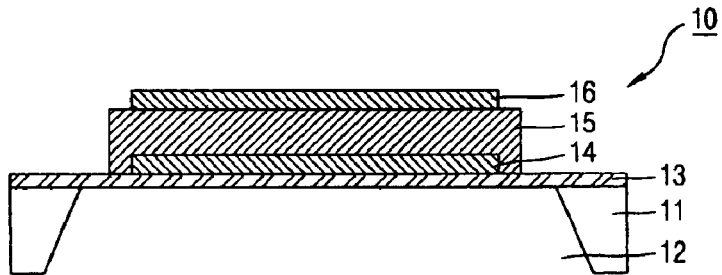
FIG. 1A is a view showing a film bulk acoustic resonator fabricated by a bulk micromachining process in accordance with the conventional art.
Figure 1B:
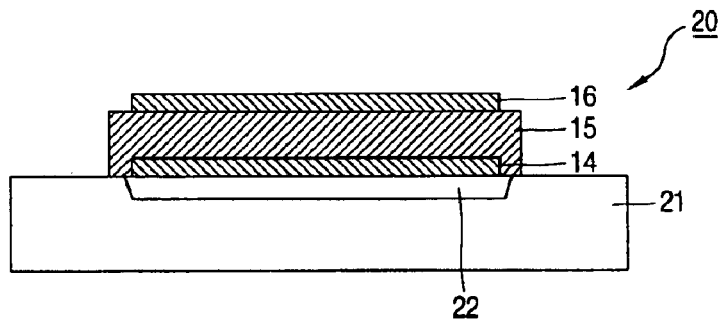
FIG. 1B is a view showing a film bulk acoustic resonator fabricated by a surface micromachining process in accordance with the conventional art so as to solve the problem of FIG. 1A.
Figure 1C:
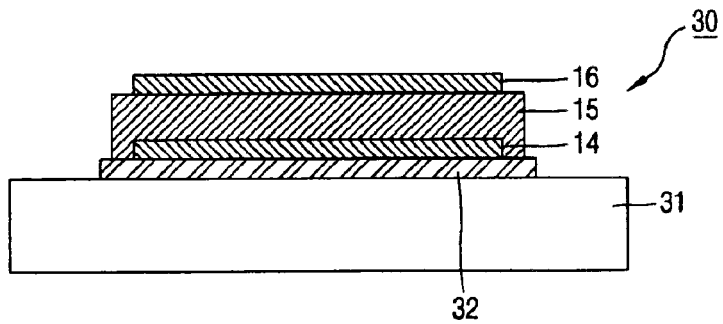
FIG. 1C is a view showing a film bulk acoustic resonator fabricated by using a film bulk acoustic reflective layer in accordance with the conventional art in order to solve the problem of FIG. 1B.
Figure 2:
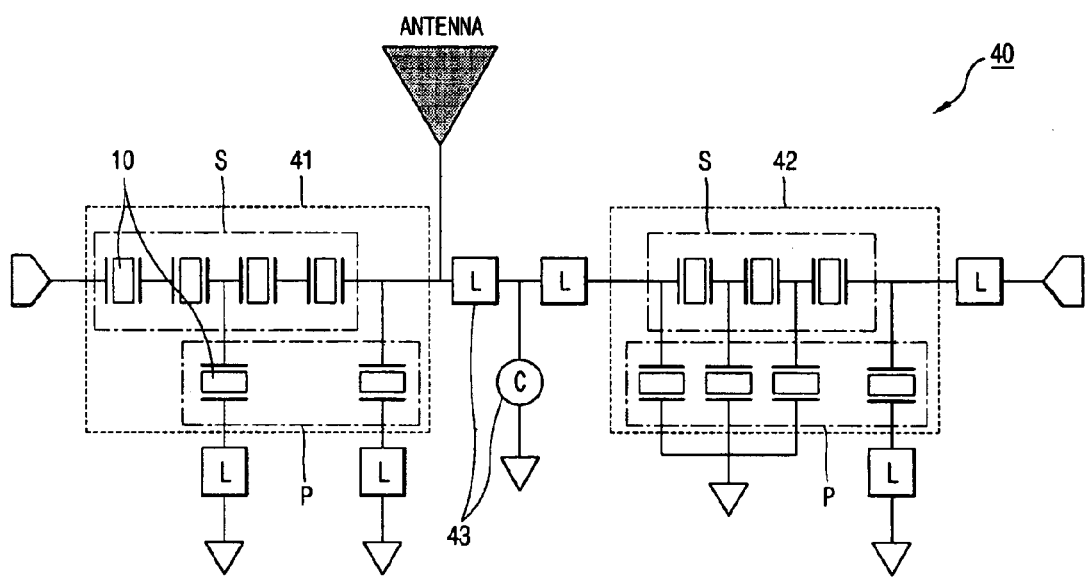
FIG. 2 is a block diagram showing a duplexer filter having the conventional film bulk acoustic resonator and passive elements.
Figure 3A:
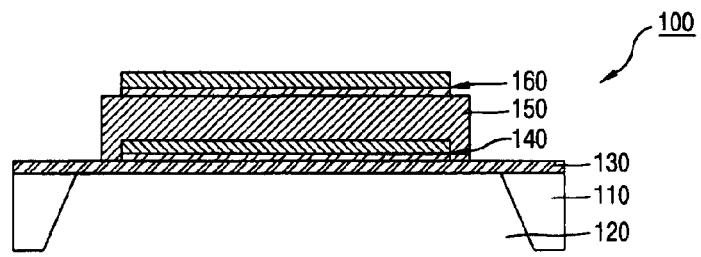
FIG. 3A is a sectional view showing a film bulk acoustic resonator according to a first embodiment of the present invention.

FIG. 3A is a sectional view showing a film bulk acoustic resonator according to a first embodiment of the present invention.

As shown, the film bulk acoustic resonator 100 according to the first embodiment of the present invention comprises: a semiconductor substrate 110; a film 130 formed on the semiconductor substrate 110; a lower electrode 140 of two layers formed on the film 130; a piezoelectric layer 150 formed on the exposed surface of the lower electrode 140 of two layers; and an upper electrode 160 of two layers formed on the piezoelectric layer 150. The lower electrode 140 of two layers and the upper electrode 160 of two layers can be formed with more than two layers.

Hereinafter, the construction of the film bulk acoustic resonator according to the first embodiment of the present invention will be explained in more detail.

The semiconductor substrate 110 can be formed with one of Si, GaAs, or the equivalent material thereof. The semiconductor substrate 110 is not limited to one specific material. The semiconductor substrate 110 can be provided with a hole 120 of a certain space in order to maximize a resonance characteristic.

The film 130 can be formed on the entire surface of the semiconductor substrate 110 as an insulator, and is formed to cover the hole 120 formed at the semiconductor substrate 110.

The lower electrode 140 is formed accordingly as metal of two layers or more than two layers is sequentially deposited on an upper surface of the film 130. For example, the lower electrode 140 is formed by sequentially depositing one pair among Ti/Mo, Cr/Mo, Ti/W, and Cr/W on the upper surface of the film 130. The Cr or Ti is used as a bonding layer and a buffer layer thus to maximize a bonding characteristic with the film 130, and the Mo or W deposited on the Cr or Ti increases a characteristic of the piezoelectric layer 150.

The piezoelectric layer 150 is deposited with a certain thickness on the upper surface of the lower electrode 140 formed accordingly as the metal of two layers or more than two layers is deposited. The piezoelectric layer 150 is formed with ZnO, AlN, or the equivalent material thereof. The piezoelectric layer 150 is not limited to a specific material.

The upper electrode 160 is formed by sequentially depositing metal of two layers or more than two layers on an upper surface of the piezoelectric layer 150. That is, the upper electrode 160 is formed by sequentially depositing one pair among Ti/Mo, Cr/Mo, Ti/W, and Cr/W on the upper surface of the piezoelectric layer 150.

Figure 3B:
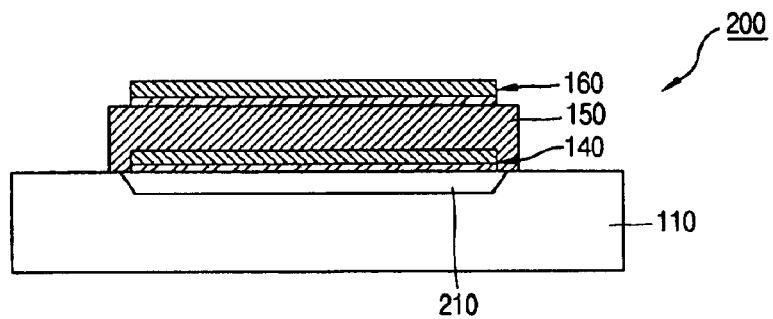
FIG. 3B is a sectional view showing a film bulk acoustic resonator according to a second embodiment of the present invention.

FIG. 3B is a sectional view showing a film bulk acoustic resonator according to a second embodiment of the present invention.

As shown in FIG. 3B, the film bulk acoustic resonator 200 according to the second embodiment of the present invention are similar as the film bulk acoustic resonators 100 shown in FIG. 3A, so that only the differences therebetween will be explained.

As shown in FIG. 3B, in the film bulk acoustic resonator 200 according to the second embodiment of the present invention, instead of forming the hole 120 at the semiconductor substrate 110, which is a difficult process, an air layer 210 of a predetermined depth is formed at a lower portion of the lower electrode 140. As known, the air layer 210 is formed by etching a sacrificial layer (not shown), and increases the characteristic of the piezoelectric layer 150. The lower electrode 140 and the upper electrode 160 are formed by depositing metal of two layers or more than two layers.

Figure 3C:
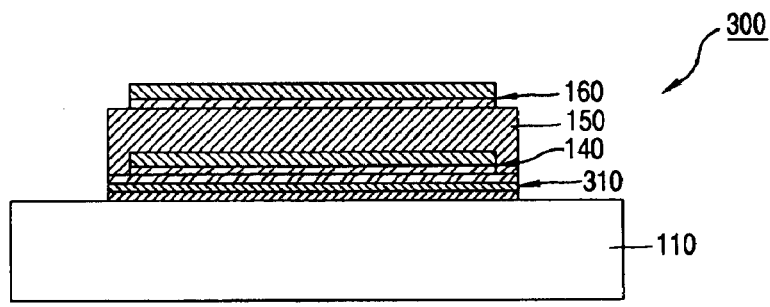
FIG. 3C is a sectional view showing a film bulk acoustic resonator according to a third embodiment of the present invention.

FIG. 3C is a sectional view showing a film bulk acoustic resonator according to a third embodiment of the present invention.

As shown in FIG. 3C, the film bulk acoustic resonator 300 according to the third embodiment of the present invention is similar as the film bulk acoustic resonator 200 shown in FIG. 3B, so that only the differences therebetween will be explained.

As shown in FIG. 3C, in the film bulk acoustic resonator 300 according to the third embodiment of the present invention, the hole 120 or the air layer 210 is not formed at the semiconductor substrate 110. That is, an acoustic wave reflective layer 310 of a multi-layer is formed between the lower electrode 140 and the semiconductor substrate 110. The acoustic wave reflective layer 310 can be formed by sequentially depositing $SiO_2$ and W several times, and increases the characteristic of the piezoelectric layer 150. As aforementioned, the lower electrode 140 and the upper electrode 160 are formed by depositing metal of two layers or more than two layers.

Hereinafter, a duplexer filter to which one film bulk acoustic resonator according to one embodiment among three embodiments of the present invention will be explained with reference to FIGS. 4A to 5B.

Figure 4A:
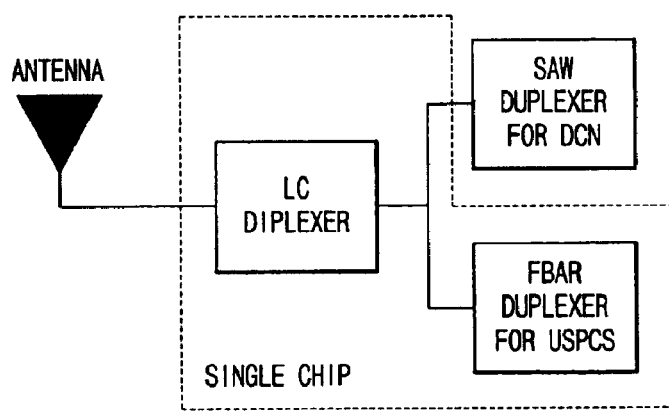
FIG. 4A is a block diagram schematically showing a construction of a duplexer filter according to a first embodiment having the film bulk acoustic resonator according to one embodiment of the present invention.

FIG. 4A is a block diagram schematically showing a construction of a duplexer filter according to a first embodiment having the film bulk acoustic resonator according to one embodiment of the present invention.

As shown in FIG. 4A, the duplexer filter having the film bulk acoustic resonator according to one embodiment of the present invention can be implemented by constituting an FBAR duplexer for united states personal communication system (USPCS), a surface acoustic wave (SAW) duplexer for digital cellular network (DCN), and an LC diplexer as one package by using a low temperature co-fired ceramic (LTCC) package having an inductor and a capacitor. The FBAR duplexer for USPCS and the LC diplexer can be implemented as a single semiconductor chip.

The LC diplexer can be fabricated through the LTCC process or can be integrated on a silicon substrate through a semiconductor process. The SAW duplexer can be fabricated on a quartz substrate or a lithium niobate substrate. Since the FBAR duplexer is integrated on the silicon substrate through the semiconductor process, the FBAR duplexer can be integrated with the LC diplexer, that is, can be implemented as a single semiconductor chip. However, the FBAR duplexer can be implemented as a single packaging with the SAW duplexer. According to this, the duplexer filter having the film bulk acoustic resonator according to the first embodiment of the present invention can be microminiaturized and cheap by implementing the FBAR duplexer for USPCS, the SAW duplexer for DCN, and the LC diplexer as one semiconductor package.

Figure 4B:
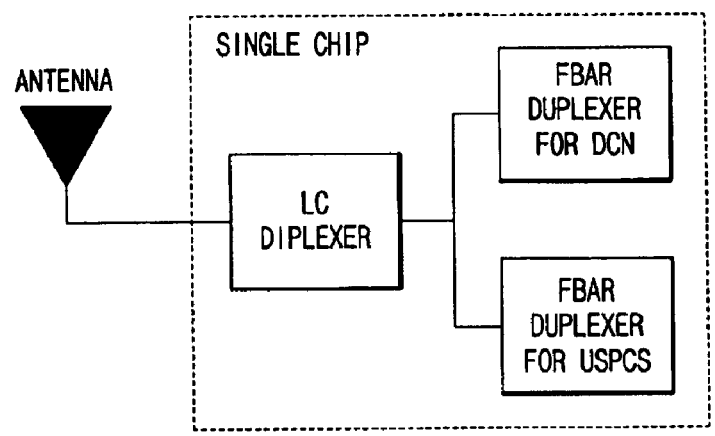
FIG. 4B is a block diagram schematically showing a construction of a duplexer filter according to a second embodiment having the film bulk acoustic resonator according to one embodiment of the present invention.

FIG. 4B is a block diagram schematically showing a construction of a duplexer filter according to a second embodiment having the film bulk acoustic resonator according to one embodiment of the present invention.

As shown in FIG. 4B, the duplexer filter according to the second embodiment having the film bulk acoustic resonator according to one embodiment of the present invention can be implemented as one package by substituting the SAW duplexer used in a cellular phone into the FBAR duplexer for DCN.

Figure 5A:
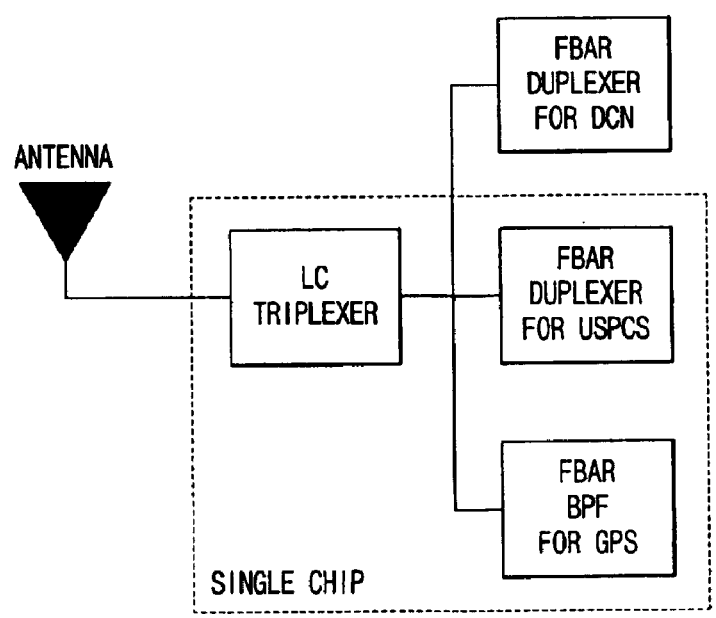
FIG. 5A is a block diagram schematically showing a construction of a duplexer filter according to a third embodiment having the film bulk acoustic resonator according to one embodiment of the present invention.

FIG. 5A is a block diagram schematically showing a construction of a duplexer filter according to a third embodiment having the film bulk acoustic resonator according to one embodiment of the present invention.

As shown in FIG. 5A, the duplexer filter according to the third embodiment having the film bulk acoustic resonator according to one embodiment of the present invention is constructed by packaging an FBAR BPF for GPS into one semiconductor package in the structure of FIG. 4B, and can be used in a terminal for triple-band (Cellular, PCS, GPS). Also, an LC triplexer is used instead of the LC diplxer. The LC triplexer divides a radio frequency (RF) communication signal inputted from an antenna into different frequency bands (for example, DCN(800 MHz band), PCS (1900 MHz band), GPS (1500 MHz band)). The LC triplexer is composed of an inductor and a capacitor, or an inductor, a capacitor, and a switch.

Figure 5B:
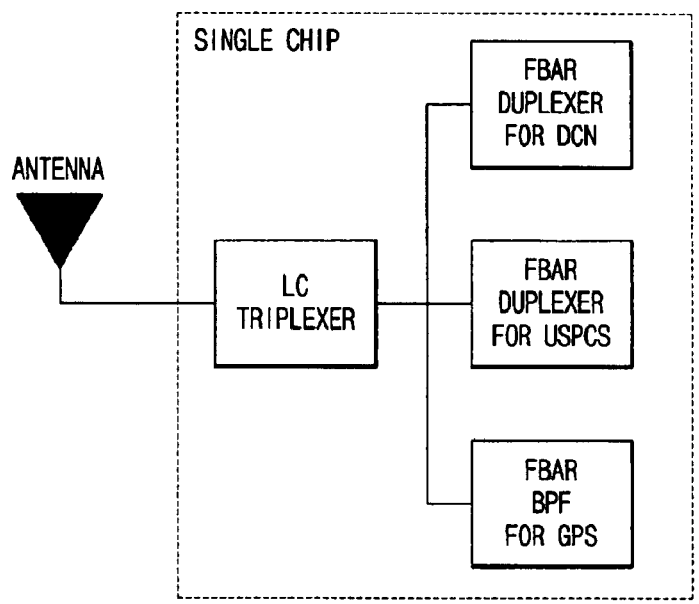
FIG. 5B is a block diagram schematically showing a construction of a duplexer filter according to a fourth embodiment having the film bulk acoustic resonator according to one embodiment of the present invention.

FIG. 5B is a block diagram schematically showing a construction of a duplexer filter according to a fourth embodiment having the film bulk acoustic resonator according to one embodiment of the present invention.

As shown in FIG. 5B, the duplexer filter according to the fourth embodiment having the film bulk acoustic resonator according to one embodiment of the present invention is constructed by packaging an FBAR BPF for GPS into one semiconductor package in the structure of FIG. 5A, and can be used in a terminal for triple-band (Cellular, PCS, GPS). For example, every device (FBAR BPF for GPS, FBAR duplexer for USPCS, LC triplexer, FBAR duplexer for DCN) shown in FIG. 5B can be integrated on the silicon substrate and can be implemented as a single semiconductor chip by using a duplexer for DNC and a band-pass filter (BPF) for GPS since the LC triplexer composed of an inductor and a capacitor can be integrated on the silicon substrate through the semiconductor process.

Hereinafter, the duplexer filter to which the film bulk acoustic resonator according to the first embodiment of the present invention is applied will be explained with reference to FIGS. 6A to 6B.

Figure 6A:
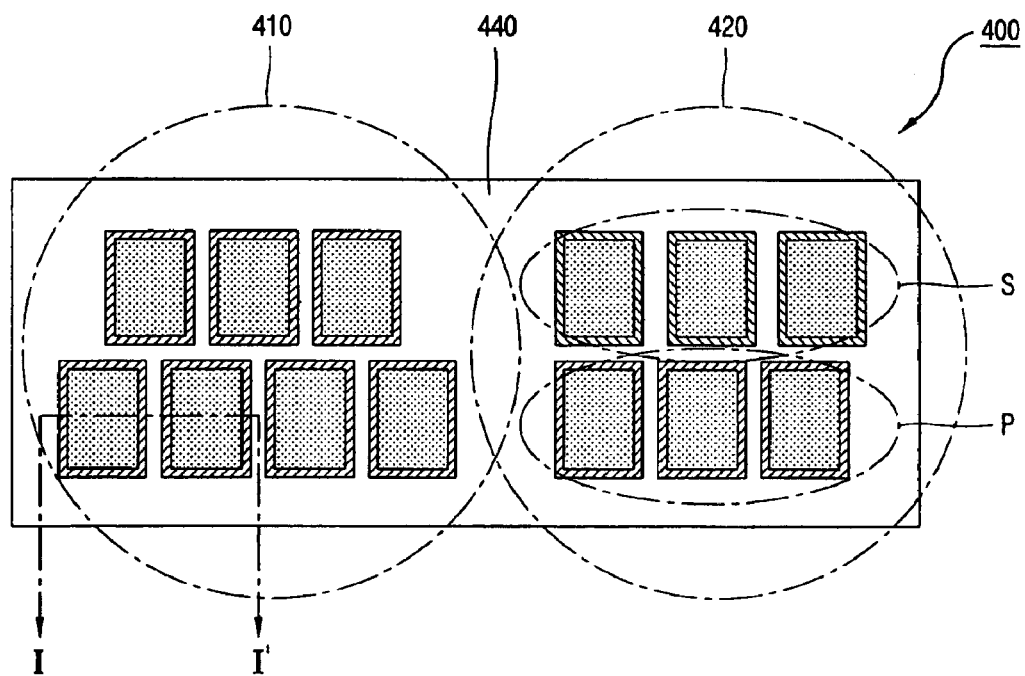
FIG. 6A is a plan view showing the duplexer filter of the first embodiment having the film bulk acoustic resonator of the first embodiment.

FIG. 6A is a plan view showing the duplexer filter of the first embodiment having the film bulk acoustic resonator of the first embodiment.

As shown, the duplexer filter according to the first embodiment 400 comprises: a semiconductor substrate 440; and a transmission side film bulk acoustic filter 410 and a reception side film bulk acoustic filter 420 formed at the semiconductor substrate 440.

The semiconductor substrate 410 is formed with one of Si, GaAs or the equivalent material thereof. Material of the semiconductor substrate 410 is not limited.

The transmission side film bulk acoustic filter 410 and the reception side film bulk acoustic filter 420 are formed by connecting a plurality of film bulk acoustic resonators 200 formed on the semiconductor substrate 440 serially and in parallel.

Figure 6B:
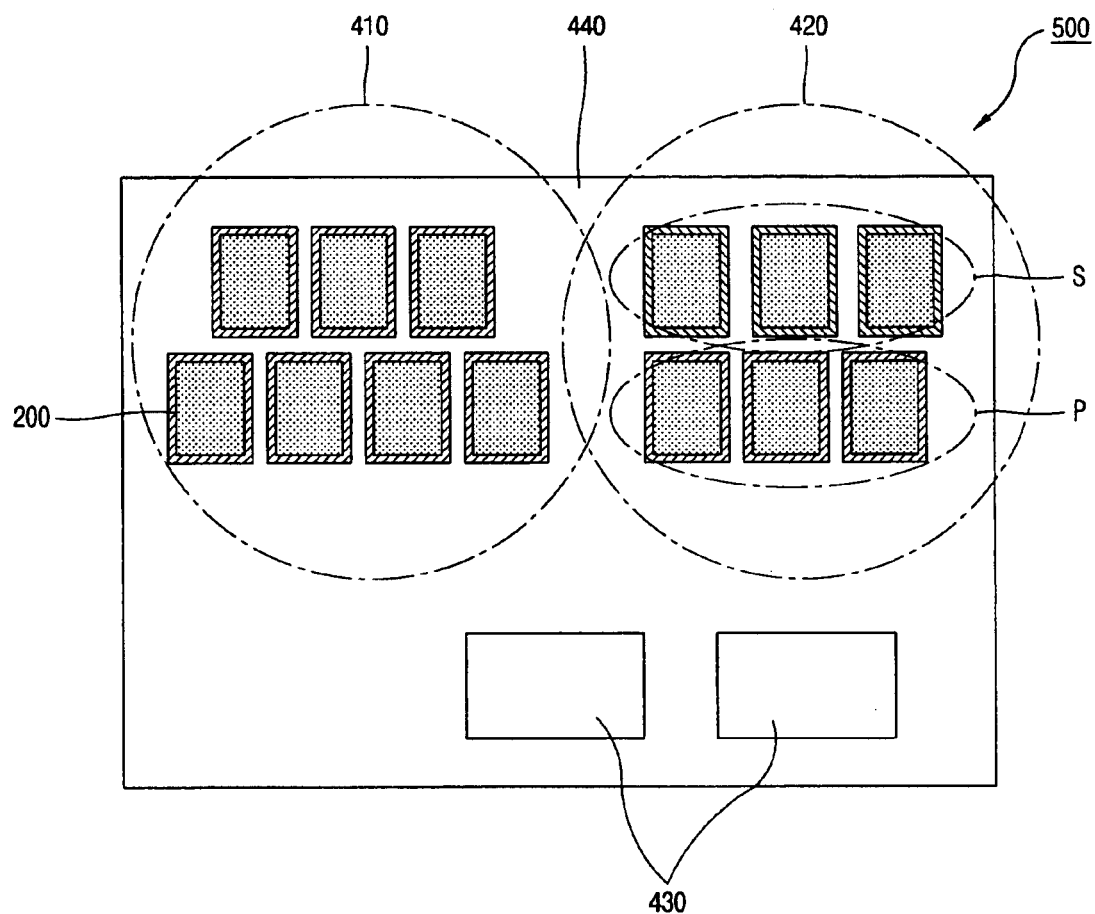
FIG. 6B is a plan view showing the duplexer filter of the second embodiment having the film bulk acoustic resonator of the second embodiment.

FIG. 6B is a plan view showing the duplexer filter of the second embodiment having the film bulk acoustic resonator of the second embodiment.

As shown, the duplexer filter 500 according to the second embodiment further comprises a plurality of passive elements 430 at one side of the transmission side film bulk acoustic filter 410 and the reception side film bulk acoustic filter 420. The passive elements 430 can be a plurality of inductors and capacitors. A film bulk acoustic filter for GPS (not shown) can be further formed at the semiconductor substrate 440.

Hereinafter, the section (I-I') of the film bulk acoustic resonator of FIG. 6A will be explained with reference to FIG. 7.

Figure 7:
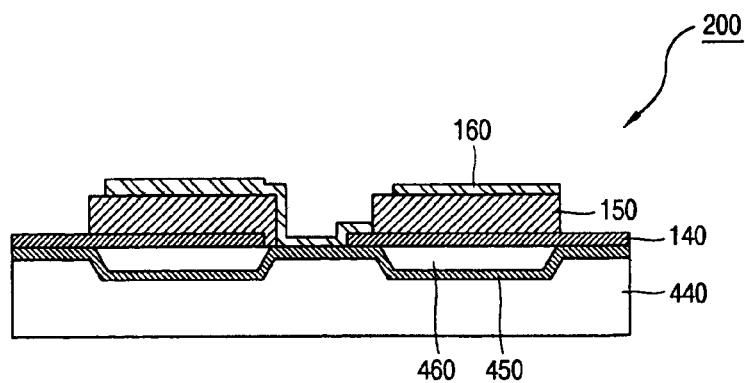
FIG. 7 is a sectional view showing a partial section of the film bulk acoustic resonator.

FIG. 7 is a sectional view showing a partial section of the film bulk acoustic resonator of FIG. 6A.

As shown in FIG. 7, the plurality of film bulk acoustic resonators 200 can be formed on one insulating film 450, or can be respectively formed without the insulating film 450. An air layer 460 is formed between the film bulk acoustic resonator 200 and the semiconductor substrate 440, and the semiconductor substrate 440 can be formed with the structure of the semiconductor substrate of FIGS. 3A, 3B, and 3C.

Figure 8A:
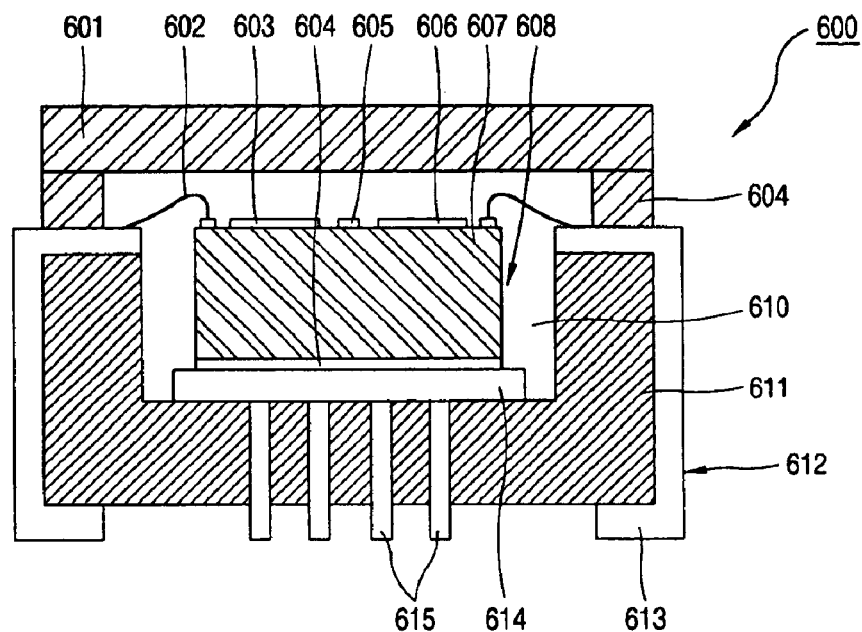
FIG. 8A is a sectional view showing a semiconductor package according to a first embodiment where the duplexer filter according to the present invention is mounted.

FIG. 8A is a sectional view showing a semiconductor package according to a first embodiment where the duplexer filter according to the present invention is mounted.

As shown, the semiconductor package according to a first embodiment 600 where the duplexer filter according to the present invention is mounted comprises: a semiconductor chip 608 having a transmission side film bulk acoustic filter 603 and a reception side film bulk acoustic filter 606; a substrate 612 where the semiconductor chip 608 is mounted; a plurality of conductive wires 602 for electrically connecting the semiconductor chip 608 and the substrate 612; and a lid 601 adhered to an adhesive 604 formed at the upper surface of the substrate 612.

The semiconductor chip 608 is arranged on the semiconductor substrate 607, and the transmission side film bulk acoustic filter 603 and the reception side film bulk acoustic filter 606 having the plurality of film bulk acoustic resonators connected serially and in parallel are formed at the upper surface of the semiconductor substrate 607. Also, a plurality of passive elements 605 such as an inductor and a capacitor are further formed at the upper surface of the semiconductor substrate 607.

The substrate 612 includes a ceramic body 611 having a cavity 610 of a predetermined space so that the semiconductor chip 608 can be mounted; a ground plane 614 formed at the bottom surface of the cavity 610 of the ceramic body 611; a plurality of conductive ground vias 615 connected to the ground plane 614 and penetrating the ceramic body 611; and a plurality of signal wires 613 formed from the outer circumference surface of the cavity 610 of the ceramic body 611 to the lower surface. The substrate 612 can be a low temperature co-fired ceramic (LTCC) or a high temperature co-fired ceramic (HTCC). The material of the substrate 612 is not limited.

The plurality of conductive wires 602 electrically connect the semiconductor chip 607, the signal wires 613, and the ground plane 614. The plurality of conductive wires 602 is formed with one of Au Wire, Al Wire, or the equivalent material thereof. The material of the plurality of conductive wires 602 is not limited.

The lid 601 is adhered to the upper surface of the substrate 612 by an adhesive 604, and protects the semiconductor chip 608 and the plurality of conductive wires 602 from the external environment.

Figure 8B:
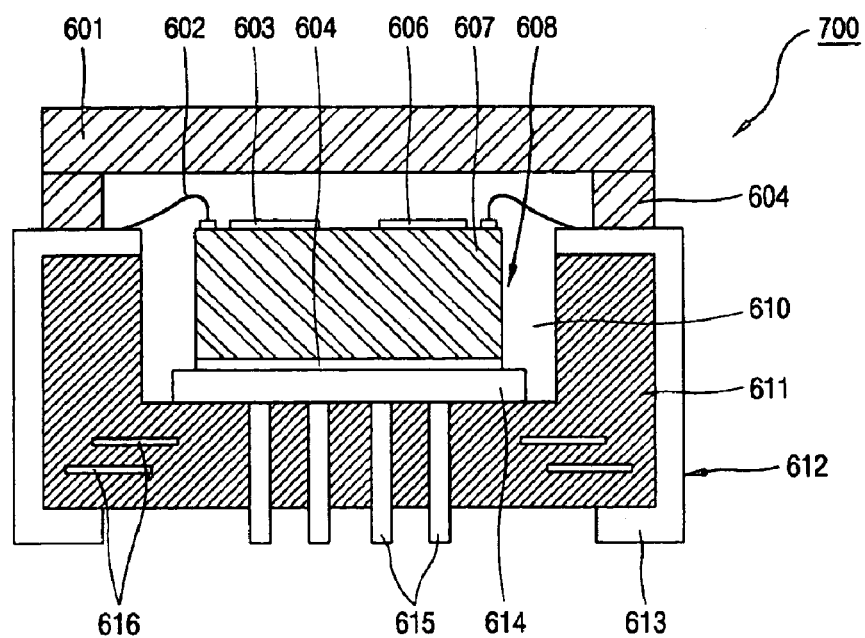
FIG. 8B is a sectional view showing a semiconductor package according to a second embodiment where the duplexer filter according to the present invention is mounted.

FIG. 8B is a sectional view showing a semiconductor package according to a second embodiment where the duplexer filter according to the present invention is mounted.

As shown, the semiconductor package according to the second embodiment 700 where the duplexer filter according to the present invention is mounted comprises: a semiconductor chip 608 having a transmission side film bulk acoustic filter 603 and a reception side film bulk acoustic filter 606; a substrate 612 where the semiconductor chip 608 is mounted; a plurality of conductive wires 602 for electrically connecting the semiconductor chip 608 and the substrate 612; and a lid 601 adhered to the upper surface of the substrate 612 by an adhesive 604. The semiconductor package according to the second embodiment 700 where the duplexer filter according to the present invention is mounted is similar as the semiconductor package 600 shown in FIG. 8A, so that only the differences therebetween will be explained.

The semiconductor chip 608 is provided with the transmission side film bulk acoustic filter 603 and the reception side film bulk acoustic filter 606, but is not provided with the plurality of passive elements 605.

A plurality of passive elements 616 such as a plurality of inductors and capacitors are formed at the substrate 612 by using the low temperature co-fired ceramic (LTCC). That is, the plurality of passive elements 616 are formed at the substrate 611, so that the passive elements 605 need not necessarily be formed at the semiconductor chip 608.

Figure 9A:
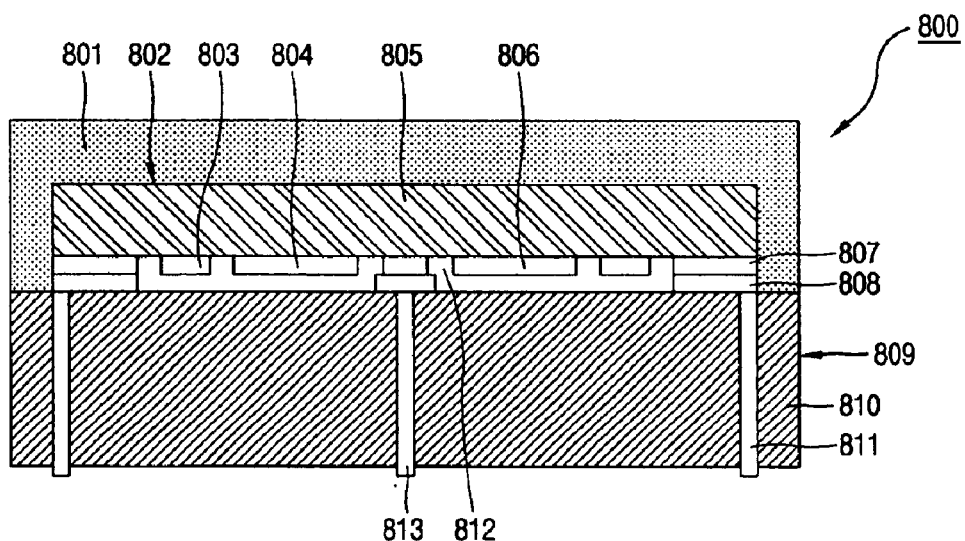
FIG. 9A is a sectional view showing a semiconductor package according to a third embodiment where the duplexer filter according to the present invention is mounted.

FIG. 9A is a sectional view showing a semiconductor package according to a third embodiment where the duplexer filter according to the present invention is mounted.

As shown, the semiconductor package according to the third embodiment 800 where the duplexer filter according to the present invention is mounted comprises: a semiconductor chip 802; a substrate 809 connected to the semiconductor chip 802 by a solder; and a sealing layer 801 for sealing the semiconductor chip 802 of the upper surface of the substrate 809.

The semiconductor chip 802 includes: a semiconductor substrate 805; and a transmission side film bulk acoustic filter 804 and a reception side film bulk acoustic filter 806 formed accordingly as a plurality of film bulk acoustic resonators are connected serially and in parallel at the upper surface of the semiconductor substrate 805. A plurality of passive elements 803 such as inductors and capacitors can be directly formed on the surface of the semiconductor substrate 805 of the semiconductor chip 802.

The substrate 809 includes: a ceramic body 810 where the semiconductor chip 802 is mounted; a plurality of wire patterns 808 formed at the upper surface of the ceramic body 810 so that the semiconductor chip 802 can be connected thereto by a solder 807 as a flip chip form with an overturned state; and a plurality of conductive ground vias 811 and signal conductive vias connected to the plurality of wire patterns 808 and penetrating the ceramic body 810. The substrate 809 can be a low temperature co-fired ceramic (LTCC) or a high temperature co-fired ceramic (HTCC).

The sealing layer 801 seals the semiconductor chip 802 for the protection form the external environment. The sealing layer 801 can be formed with one of epoxy, polymer, or the equivalent material thereof. The material of the sealing layer 801 is not limited.

An air gap 812 for preventing the characteristics of the transmission side film bulk acoustic filter 804, the reception side film bulk acoustic filter 806, and the passive elements 803 formed at the lower surface of the semiconductor chip 802 from being deteriorated is further formed between the lower surface of the semiconductor chip 802 and the substrate 809. That is, the sealing layer 810 is not formed between the lower surface of the semiconductor chip 802 and the substrate 809.

Figure 9B:
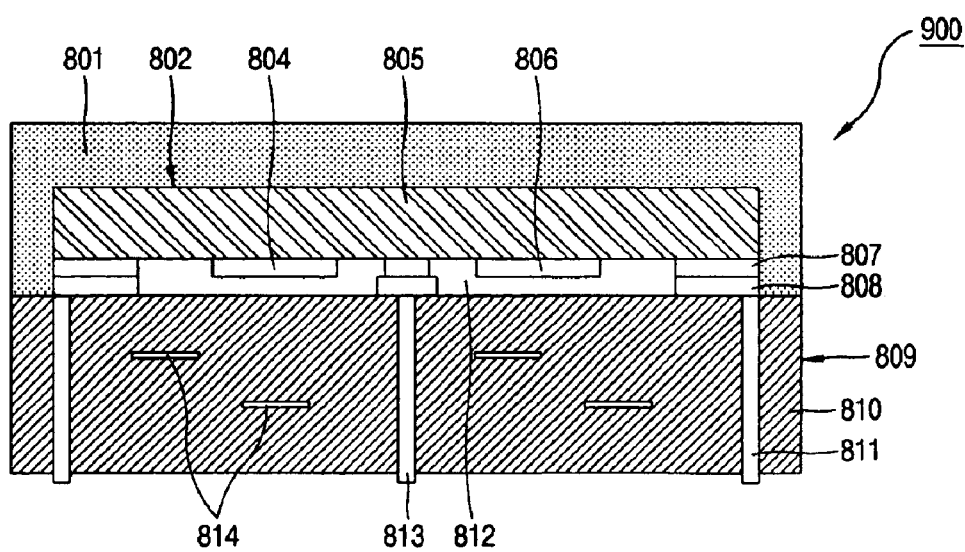
FIG. 9B is a sectional view showing a semiconductor package according to a fourth embodiment where the duplexer filter according to the present invention is mounted.

FIG. 9B is a sectional view showing a semiconductor package according to a fourth embodiment where the duplexer filter according to the present invention is mounted.

As shown, the semiconductor package according to the fourth embodiment 900 where the duplexer filter according to the present invention is mounted comprises: a semiconductor chip 802 having a transmission side film bulk acoustic filter 804 and a reception side film bulk acoustic filter 806; a substrate 809 where the semiconductor chip 802 is mounted with an overturned state; a sealing layer 801 for sealing the semiconductor chip 802 of the upper surface of the substrate 809. The semiconductor package according to the fourth embodiment 900 where the duplexer filter according to the present invention is mounted is similar as the semiconductor package 800 shown in FIG. 9A, so that only the differences therebetween will be explained.

First, the semiconductor chip 802 is provided with the transmission side film bulk acoustic filter 804 and the reception side film bulk acoustic filter 806, but is not provided with the plurality of passive elements 803.

Second, a plurality of passive elements 814 such as inductors and capacitors are formed at the substrate 809 by using the low temperature co-fired ceramic (LTCC). That is, the plurality of passive elements 814 are formed at the substrate 809, so that the passive elements 803 need not necessarily be formed at the semiconductor chip 802.

Figure 10A:
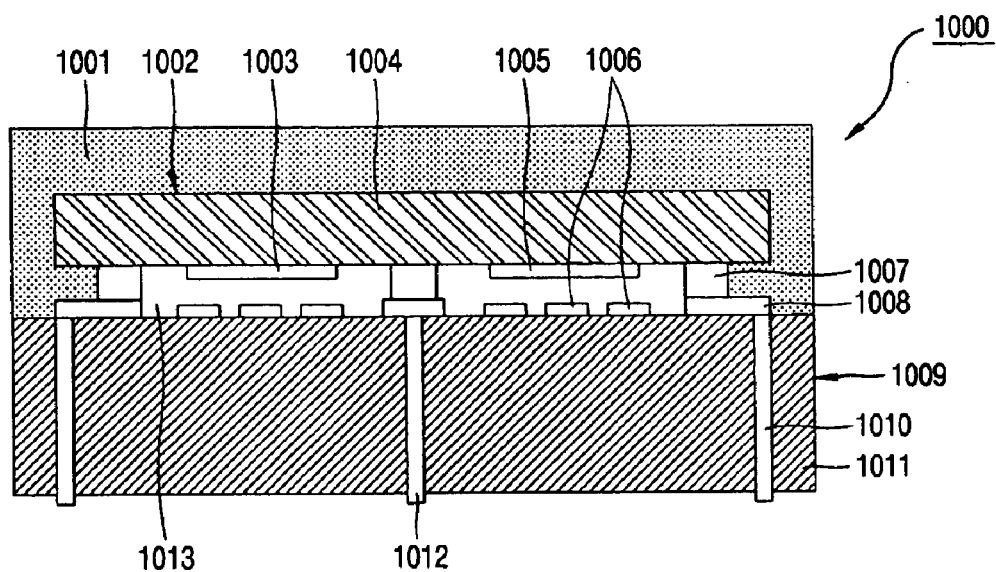
FIG. 10A is a sectional view showing a semiconductor package according to a fifth embodiment where the duplexer filter according to the present invention is mounted.

FIG. 10A is a sectional view showing a semiconductor package according to a fifth embodiment where the duplexer filter according to the present invention is mounted.

As shown, the semiconductor package according to the fifth embodiment 1000 where the duplexer filter according to the present invention is mounted comprises: a semiconductor chip 1002; a substrate 1009 to which the semiconductor chip 1002 is connected with an overturned state; and a sealing layer 1001 for sealing the semiconductor chip 1002.

The semiconductor chip 1002 includes: a semiconductor substrate 1004; and a transmission side film bulk acoustic filter 1003 and a reception side film bulk acoustic filter 1005 formed at the upper surface of the semiconductor substrate 1004 accordingly as the plurality of film bulk acoustic resonators are connected serially and in parallel.

The substrate 1009 includes: an insulating body 1011 where the semiconductor chip 1002 is mounted; and a plurality of wire patterns 1008 formed at the upper surface of the insulating body 1011 so that the semiconductor chip 1002 can be connected thereto by a solder 1007 as a flip chip form with an overturned state.

The insulating body 1011 of the substrate 1008 is formed with one of silicon, a printed circuit board, ceramic, or the equivalent materials thereof having a high resistance. The material of the insulating body 1011 is not limited. A plurality of passive elements 1006 such as inductors and capacitors are further formed at a region corresponding to the semiconductor chip 1002 at the upper surface of the insulating body 1011 of the substrate 1009.

As shown in FIG. 10A, conductive ground vias 1010 and a signal conductive via 1012 are penetratingly-formed at the insulating body 1011 of the substrate 1009, and the conductive ground vias 1010 are connected to the plurality of wire patterns 1008 formed at the upper surface of the insulating body 1011.

The sealing layer 1001 seals the semiconductor chip 1002 of the upper surface of the insulating body 1011 for the protection from the external environment.

An air gap 1013 for preventing the characteristics of the transmission side film bulk acoustic filter 1003, the reception side film bulk acoustic filter 1005 formed at the lower surface of the semiconductor chip 1002, and the passive elements 1006 formed at the upper surface of the substrate 1009 from being deteriorated is further formed between the lower surface of the semiconductor chip 1002 and the substrate 1009. That is, the sealing layer 1001 is not formed between the semiconductor chip 1002 and the substrate 1009. The sealing layer 1001 can be formed with one of epoxy, polymer, or the equivalent material thereof. The material of the sealing layer 1001 is not limited.

Figure 10B:
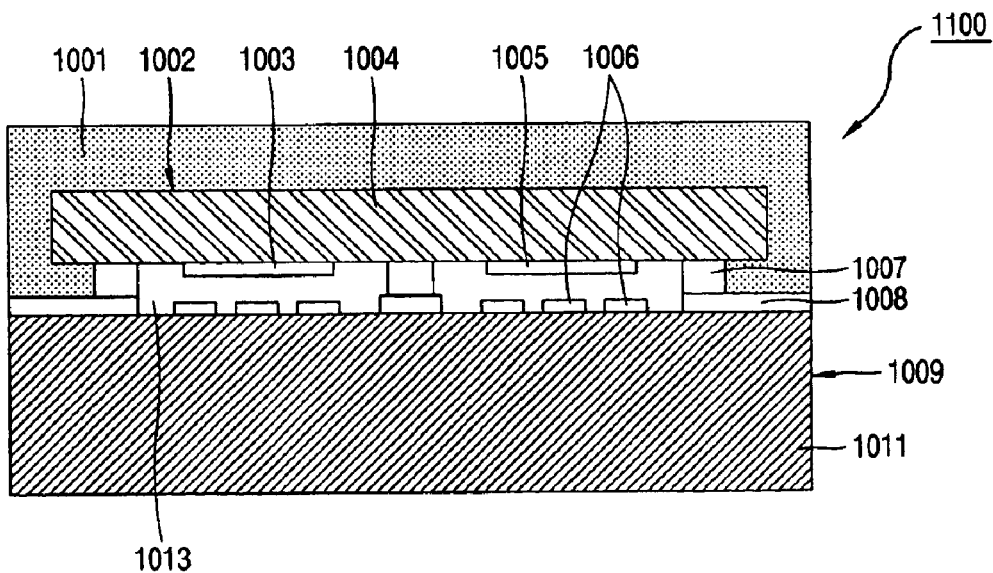
FIG. 10B is a sectional view showing a semiconductor package according to a sixth embodiment where the duplexer filter according to the present invention is mounted.

FIG. 10B is a sectional view showing a semiconductor package according to a sixth embodiment where the duplexer filter according to the present invention is mounted.

The semiconductor package according to the sixth embodiment 1100 where the duplexer filter according to the present invention is mounted is similar as the semiconductor package 1000 shown in FIG. 10A, so that only the differences therebetween will be explained.

As shown in FIG. 10B, the semiconductor package 1000 according to the sixth embodiment of the present invention where the duplexer filter is mounted comprises: a semiconductor chip 1002; a substrate 1009 to which the semiconductor chip 1002 is connected with an overturned state; and a sealing layer 1001 for sealing the semiconductor chip 1002. A plurality of wire patterns 1008 formed at the upper surface of the insulating body 1011 of the substrate 1009 are extended to the outside of the semiconductor chip 1002 along the upper surface of the insulating body 1011. The insulating body 1011 of the substrate 1009 is not provided with conductive ground vias 1010 and signal conductive vias 1012.

As aforementioned, according to the film bulk acoustic resonator of the present invention, metal of two layers or more than two layers is sequentially deposited thus to become a lower electrode, thereby having an excellent bonding characteristic between the lower electrode and the substrate and having an excellent characteristic of the piezoelectric layer deposited on the lower electrode. That is, the bonding characteristic with the substrate is maximized by using Ti or Cr as a bonding layer and a buffer layer. Also, since the piezoelectric layer is formed on Mo or W, an excellent characteristic of the piezoelectric layer can be obtained.

Additionally, according to the duplexer filter of the present invention, the transmission side film bulk acoustic filter and the reception side film bulk acoustic filter for filtering a certain band in a transmission/reception frequency by connecting a plurality of film bulk acoustic resonators serially and in parallel are formed in one semiconductor chip, and the plurality of passive elements are formed at the periphery of the transmission side and reception side film bulk acoustic filters, thereby microminiaturizing the size of the duplexer filter connected to an antenna of a mobile phone and etc.

Also, according to the semiconductor package of the present invention, the plurality of passive elements are formed not only at the semiconductor chip but also at the inside or the surface of the substrate where the semiconductor chip is mounted, thereby providing the semiconductor package suitable for the duplexer filter and microminiaturizing the size of the semiconductor package.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A semiconductor package comprising:

a semiconductor chip having a transmission side film bulk acoustic filter and a reception side film bulk acoustic filter formed at an upper surface of a semiconductor substrate accordingly as a plurality of film bulk acoustic resonators are connected serially and in parallel;

a substrate provided with a ceramic body where the semiconductor chip is mounted, a plurality of wire patterns formed at an upper surface of the ceramic body so that the semiconductor chip can be connected thereto by a solder as a flip chip form with an overturned state, and a plurality of conductive ground vias and signal conductive vias connected to the plurality of wire patterns and penetrating the ceramic body; and a sealing layer for sealing the semiconductor chip of the upper surface of the ceramic body for protection from the external environment, wherein the sealing layer is one selected from epoxy or polymer.

2. The semiconductor package of claim 1, further comprising a plurality of passive elements at the semiconductor chip.

3. The semiconductor package of claim 1, wherein the substrate is one selected from a low temperature co-fired ceramic (LTCC) or a high temperature co-fired ceramic (HTCC).

4. The semiconductor package of claim 1, wherein the substrate is an LTCC where a plurality of passive elements are formed, and the plurality of passive elements are formed inside the LTCC.

5. The semiconductor package of claim 1, further comprising an air gap for preventing characteristics of the transmission side film bulk acoustic filter and the reception side film bulk acoustic filter formed at the surface of the semiconductor substrate from being deteriorated between the lower surface of the semiconductor chip and the substrate.

* * * * *